(12) United States Patent
Tuttle

(10) Patent No.: US 6,413,788 B1
(45) Date of Patent: Jul. 2, 2002

(54) KEEPERS FOR MRAM ELECTRODES

(75) Inventor: Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/796,326

(22) Filed: Feb. 28, 2001

(51) Int. Cl.$^7$ .............................................. H01L 21/00
(52) U.S. Cl. ........................... 438/3; 438/692; 257/326
(58) Field of Search ........................... 438/3; 365/158; 252/62; 156/643; 257/661

(56) References Cited

U.S. PATENT DOCUMENTS

| | | | |
|---|---|---|---|
| 3,623,032 A | | 11/1971 | Schapira ............... 340/174 BC |
| 3,623,035 A | | 11/1971 | Kobayashi et al. ... 340/174 BC |
| 3,816,909 A | | 6/1974 | Maeda et al. .................. 29/604 |
| 3,947,831 A | | 3/1976 | Kobayashi et al. ... 340/174 BC |
| 4,044,330 A | | 8/1977 | Johnson et al. ......... 340/166 R |
| 4,060,794 A | | 11/1977 | Feldman et al. ............ 364/900 |
| 4,158,891 A | | 6/1979 | Fisher ......................... 365/222 |
| 4,455,626 A | | 6/1984 | Lutes .......................... 365/158 |
| 4,731,757 A | | 3/1988 | Daughton et al. ........... 365/173 |
| 4,780,848 A | | 10/1988 | Daughton et al. .......... 365/173 |
| 5,039,655 A | | 8/1991 | Pisharody ...................... 505/1 |
| 5,064,499 A | * | 11/1991 | Fryer .......................... 156/643 |
| 5,140,549 A | | 8/1992 | Fryer .......................... 365/171 |
| 5,496,759 A | | 3/1996 | Yue et al. |
| 5,547,599 A | | 8/1996 | Wolfrey et al. .......... 252/62.54 |
| 5,569,617 A | | 10/1996 | Yeh et al. |
| 5,587,943 A | * | 12/1996 | Torok et al. ................. 365/158 |
| 5,661,062 A | * | 8/1997 | Prinz ............................. 438/3 |
| 5,741,435 A | * | 4/1998 | Beetz, Jr. et al. ......... 252/62.55 |
| 5,861,328 A | | 1/1999 | Tehrani et al. ............... 438/210 |
| 5,902,690 A | | 5/1999 | Tracy et al. ................. 428/693 |
| 5,956,267 A | | 9/1999 | Hurst et al. .................. 365/158 |
| 6,048,739 A | * | 4/2000 | Hurst et al. ..................... 438/3 |
| 6,165,803 A | | 12/2000 | Chen et al. ..................... 438/3 |
| 6,174,737 B1 | | 1/2001 | Durlam et al. ................. 438/3 |
| 6,211,090 B1 | | 4/2001 | Durlam et al. ............... 438/692 |

FOREIGN PATENT DOCUMENTS

| | | | |
|---|---|---|---|
| DE | 198 36 567 A1 | 2/2000 | ........... H01L/27/22 |
| WO | WO 00/19440 | 6/2000 | ........... G11C/11/16 |

OTHER PUBLICATIONS

Pohm et al., "The Architecture of a High Performance Mass Store with GMR Memory Cells," *IEEE Transactions on Magnetics*, vol. 31, No. 6, Nov. 1995.

Pohm et al., "Experimental and Analytical Properties of 0.2 Micron Wide, Multi-Layer, GMR, Memory Elements", *IEEE Transactions on Magnetics*, vol. 32, No. 5, Sep. 5, 1996.

Prinz, "Magnetoelectronics", *Science Magazine*, vol. 282, Nov. 27, 1998.

Wang et al., easibiity of Ultra-Dense Spin-Tunneling Random Access Memory, *IEEE Transactions on Magnetics*, vol. 33, No. 6, Nov. 1997.

* cited by examiner

Primary Examiner—David Nelms
Assistant Examiner—Tu-Tu Ho
(74) Attorney, Agent, or Firm—Knobbe, Martens, Olson & Bear, LLP

(57) ABSTRACT

A magnetic memory device, preferably a magnetic random access memory (MRAM) and method for forming same are described wherein a bit region sensitive to magnetic fields and preferably comprising a tunneling magnetoresistance (TMR) structure is located between a top electrode with a magnetic keeper and a bottom electrode with a magnetic keeper. The top electrode is preferably made of copper using a damascene process. The magnetic keeper of the top electrode includes at least a magnetic laterial layer (e.g., Co—Fe) but in the illustrated embodiments also includes one or more barrier layer (e.g., Ta). Various embodiments describe structures wherein the magnetic keeper stack is in contact with one, two or three surfaces of the top electrode, which face outward from the device.

36 Claims, 16 Drawing Sheets

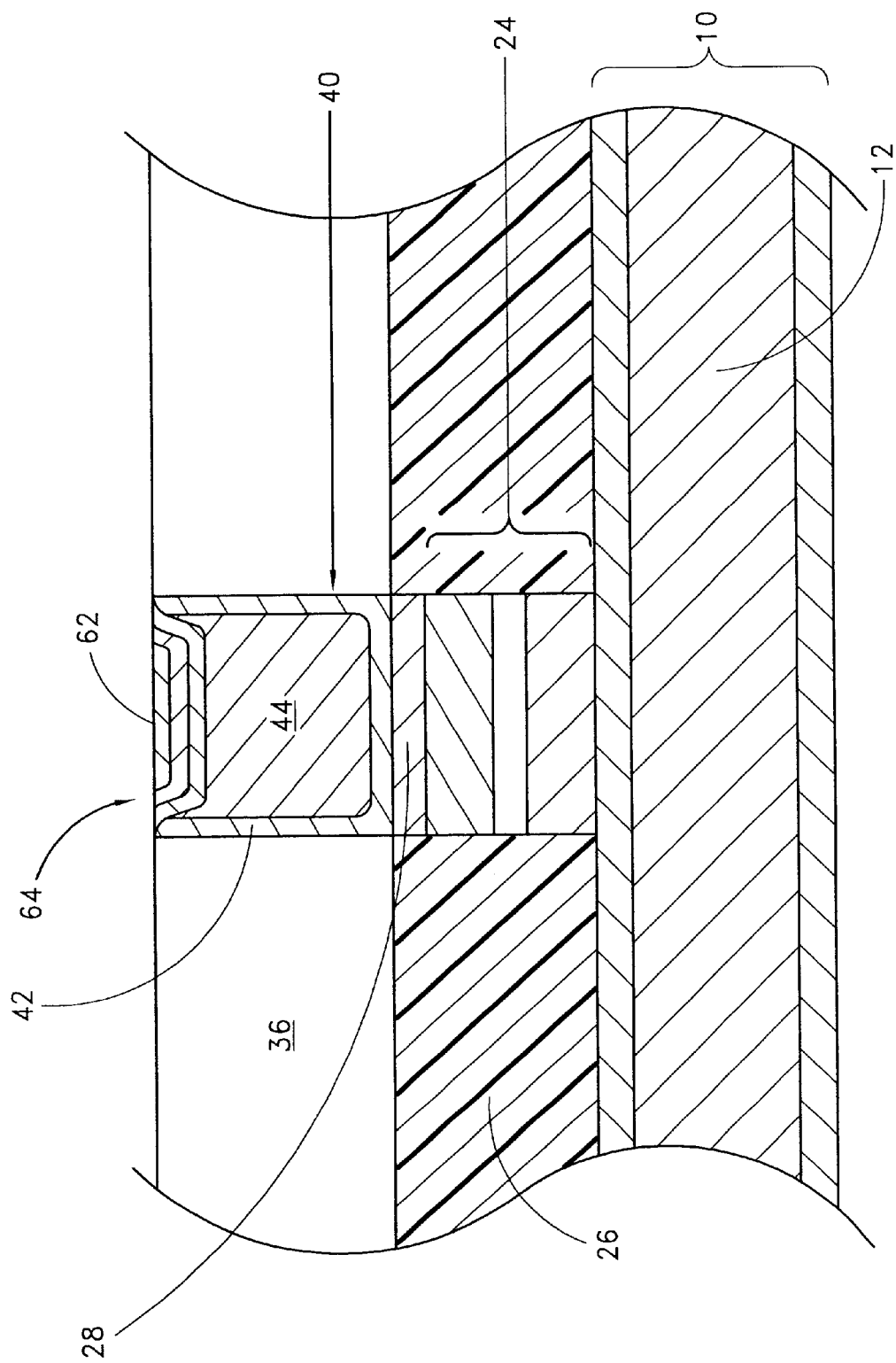

KEEPERS FOR MRAM ELECTRODES

BACKGROUND OF THE INVENTION

1. Field of the Invention

This invention is directed generally to magnetic memory devices for storing digital information and, more particularly, to methods and structures for confining magnetic fields produced by these devices.

2. Description of the Related Art

The digital memory most commonly used in computers and computer system components is the dynamic random access memory (DRAM), wherein voltage stored in capacitors represents digital bits of information. Electric power must be supplied to these memories to maintain the information because, without frequent refresh cycles, the stored charge in the capacitors dissipates, and the information is lost. Memories that require constant power are known as volatile memories.

Non-volatile memories do not need refresh cycles to preserve their stored information, so they consume less power than volatile memories. There are many applications where non-volatile memories are preferred or required, such as in cell phones or in control systems of automobiles.

Magnetic random access memories (MRAMs) are non-volatile memories. Digital bits of information are stored as alternative directions of magnetization in a magnetic storage element or cell. The storage elements may be simple, thin ferromagnetic films or more complex layered magnetic thin-film structures, such as tunneling magnetoresistance (TMR) or giant magnetoresistance (GMR) elements.

Memory array structures are formed generally of a first set of parallel conductive lines covered by an insulating layer, over which lies a second set of parallel conductive lines, perpendicular to the first lines. Either of these sets of conductive lines can be the bit lines and the other the word lines. In the simplest configuration the magnetic storage cells are sandwiched between the bit lines and the word lines at their intersections. More complicated structures with transistor or diode configurations can also be used. When current flows through a bit line or a word line, generates a magnetic field around the line. The arrays are designed so that each conductive line supplies only part of the field needed to reverse the magnetization of the storage cells. Switching occurs only at those intersections where both word and bit lines are carrying current. Neither line by itself can switch a bit; only those cells addressed by both bit and word lines can be switched.

Magnetic memory arrays can be fabricated as part of integrated circuits (ICs) using thin film technology. As for any IC device, it is important to use as little space as possible. But as packing density is increased, there are tradeoffs to be considered. When the memory cell size is reduced, the magnetic field required to write to the cell is increased, making it more difficult for the bit to be written. When the width and thickness of bit lines and word lines are reduced, there is higher current density, which can cause electro-migration problems in the conductors. Additionally, as conducting lines are made closer together, the possibility of cross talk between a conducting line and a cell adjacent to the addressed cell is increased. If this happens repeatedly, the stored magnetic field of the adjacent cell is eroded through magnetic domain creep, and the information in the cell can be rendered unreadable.

In order to avoid affecting cells adjacent to the ones addressed, the fields associated with the bit and word lines must be strongly localized. Some schemes to localize magnetic fields arising from conducting lines have been taught in the prior art.

In U.S. Pat. No. 5,039,655, Pisharody taught a method of magnetically shielding conductive lines in a thin-film magnetic array memory on three sides with a superconducting film. At or near liquid nitrogen temperatures (i.e., below the superconducting transition temperature), superconducting materials exhibit the Meissner effect, in which perfect conductors cannot be permeated by an applied magnetic field. While this is effective in preventing the magnetic flux of the conductive line from reaching adjacent cells, its usefulness is limited to those applications where very low temperatures can be maintained.

In U.S. Pat. No. 5,956,267, herein referred to as the '267 patent, Hurst et al. taught a method of localizing the magnetic flux of a bottom electrode for a magnetoresistive memory by use of a magnetic keeper. A layered stack comprising barrier layer/soft magnetic material layer/barrier layer was deposited as a partial or full lining along a damascene trench in a insulating layer. Conductive material was deposited over the lining to fill the trench. Excess conductive material and lining layers that were on or extended above the insulating layer were removed by polishing. Thus, the keeper material lined bottom and side surfaces of the bottom conductor, leaving the top surface of the conductor, facing the bit, free of the keeper material.

The process of the '267 patent aids in confining the magnetic field of the cell and avoiding cross-talk among bits. A need exists, however, for further improvements in lowering the writing current for a given magnetic field. By lowering the current required to write to a given cell, reliability of the cell is improved.

SUMMARY OF THE INVENTION

A magnetic memory array, preferably comprising an MRAM, with a series of top electrodes in contact with a magnetic keeper on at least one surface, a series of bottom electrodes and magnetic bit regions located therebetween is described in accordance with the current invention. The magnetic bit regions may comprise tunneling magnetoresistance or giant magnetoresistance structures.

In an MRAM device, the structure of a magnetic keeper for the top conductor made by a damascene process includes stacked layers of barrier and magnetic materials, at least a portion of the layers magnetically shielding at least one surface of the top conductor.

A method of forming a magnetic keeper for a top electrode in an MRAM device is also described, which includes depositing an insulating layer over a magnetic storage element, etching and then filling a damascene trench with a conductive material, planarizing to remove the conductive material from over the insulating layer and then depositing a magnetic material over the conductive material.

BRIEF DESCRIPTION OF THE DRAWINGS

The figures are meant to help illustrate, but not limit, the invention and are not drawn to scale. The illustrated embodiment has bit lines at the bottoms of the figures and has word lines at the tops of the figures. The skilled artisan will understand that there are many other possible configurations for MRAM structures, which can take advantage of the teachings set forth in this invention.

FIG. 4C illustrates the structure of FIG. 4B after planarizing.

DETAILED DESCRIPTION OF THE PREFERRED EMBODIMENT

Although aluminum is used commonly as a conductor in semiconductor devices, it has difficulty meeting the high electric current requirements of magnetic memory devices without suffering from damage due to electromigration. Copper is more suitable for high current applications as it is more resistant to electromigration. Whereas aluminum lines can be fabricated by patterning with photoresist and dryetching, copper is difficult to dry etch. Copper lines are thus preferably fabricated by a damascene process. Trenches are formed in an insulating layer, a copper layer is deposited to overfill the trench and the excess copper is removed by polishing down to the surface of the insulating layer.

As discussed above, the '267 patent provides magnetic keepers for bottom electrodes, fabricated by a damascene process. The preferred embodiments described herein provide magnetic keepers, in various configurations, for top electrodes made by a damascene process in integrated magnetic memory devices. The process of the '267 patent, however, is not suitable for forming keepers for a top electrode.

Figure 1A:
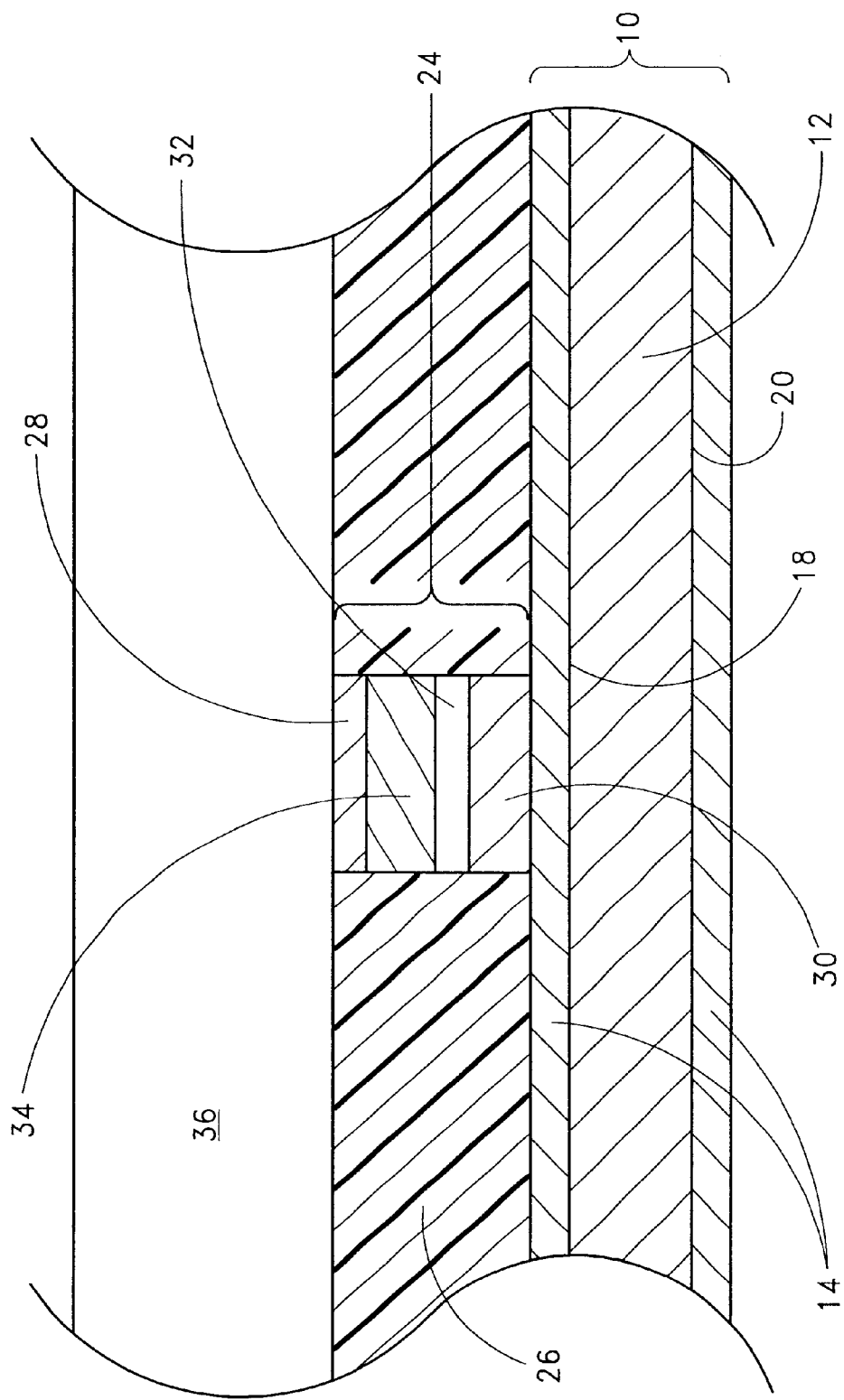
FIG. 1A is a cross section of a partially fabricated MRAM structure showing the bottom electrode, the bit region and the overlying insulating layer before the top electrode is fabricated.
Figure 1B:
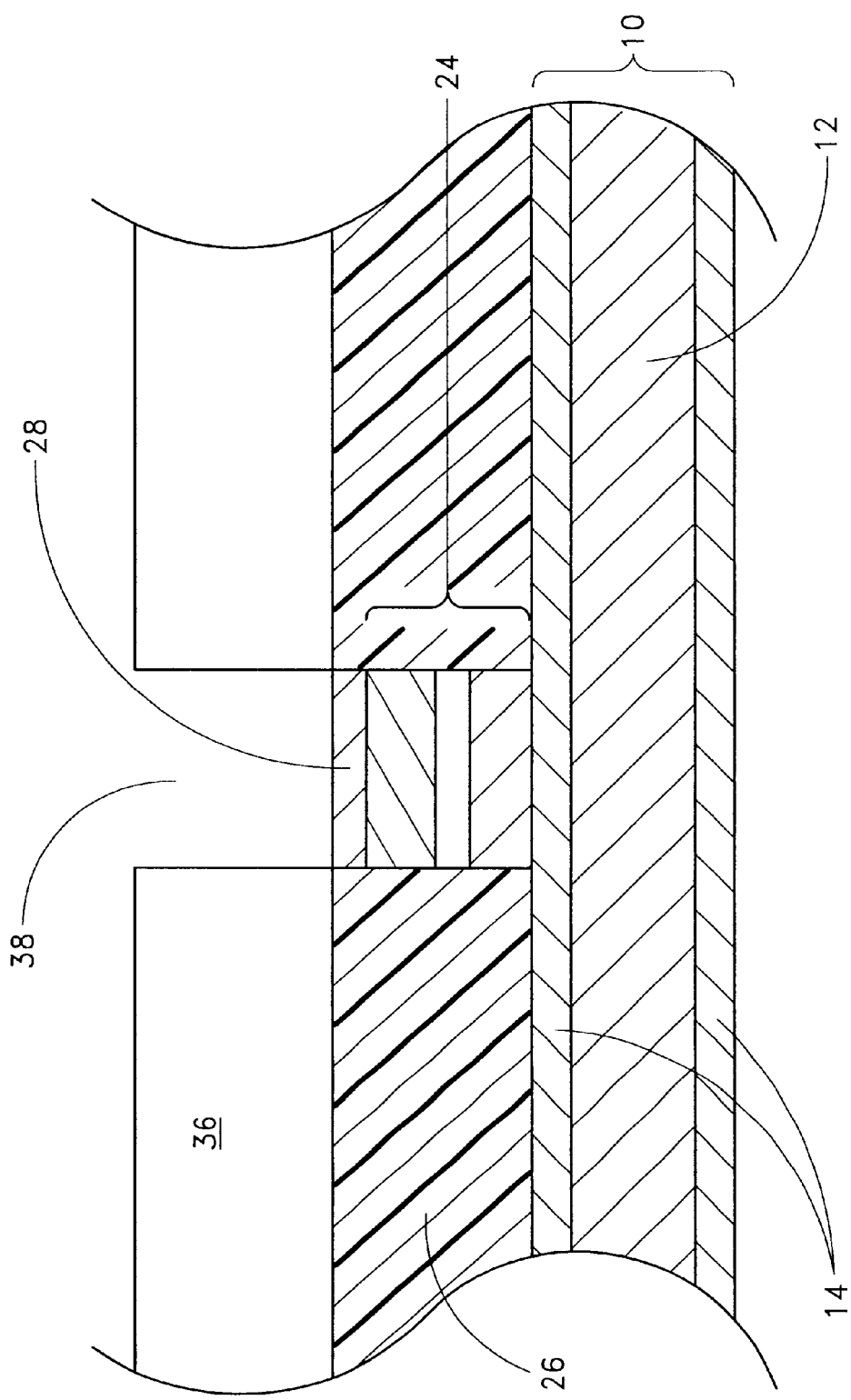
FIG. 1B illustrates the partially fabricated MRAM structure of FIG. 1A after a damascene trench has been etched into the insulating layer.

The preferred embodiments of the invention can be understood with reference to the figures. Only individual magnetic memory structures are shown in the figures, but it will be understood that the illustrated individual cells are representative of similar structures repeated across a memory array. FIGS. 1A and 1B show, in cross section, a partially fabricated MRAM cell that will be used as the starting point for describing the embodiments contained herein.

The memory cell comprises a bottom electrode structure 10, which, in turn, comprises a lower conducting line 12 that runs from side to side across the page and is made, preferably, of copper. The bottom electrode 10 typically overlays a semiconductor substrate (not shown). A barrier layer 14 preferably encapsulates the copper line on all four sides along its length. The barrier layer 14 can comprise tantalum (Ta) or another material that blocks diffusion of copper and is compatible with integrated circuit manufacture. In this cross-sectional view, the copper line is cut near the center along its long axis, so that only the portions of the barrier layer that clad the lower line 12 along the upper surface 18 and the lower surface 20 can be seen. The cladding along one side of the line is above the plane of the page and along the other side of the line is below the plane of the page. In a preferred embodiment (and according to the prior art), the upper surface 18 of the line 12 is covered by only the barrier layer 14, but the lower surface 20 and the two side surfaces are further clad by a sandwich structure comprising barrier layer/soft magnetic material/barrier layer, which serves as a magnetic keeper for the conducting line 12, in accordance with the teachings of the '267 patent. A "magnetic keeper," as used herein, includes at least a magnetic material layer; in the preferred embodiments the magnetic keeper also includes one or two barrier layers. There is preferably no magnetic material on the top surface of the lower line 12 that faces toward a magnetic memory cell or bit 24 capped with a barrier layer 28 and formed in an insulating layer 26. Magnetic material between the lower line 12 and the bit 24 would interfere with the magnetic field from the lower line 12 acting upon the magnetic bit 24.

In FIGS. 1A and 1B, as well as the embodiments discussed below, the bottom electrode is formed along the lower line 12, which serves as a bit line in the illustrated "cross-point" circuit configurations. In other arrangements, the skilled artisan will readily appreciate that the bit line can be formed above the bit element and the word line below, and that the bit can also be latched to a transistor or diode.

The magnetic memory cell 24 can be any magnetic structure that stores bits of information defined by the direction or polarity of magnetization, including thin ferromagnetic films or more complex layered magnetic thin-film structures, such as tunneling magnetoresistance (TMR) or giant magnetoresistance (GMR) elements.

The preferred magnetic memory cell is a TMR structure. The illustrated TMR structure comprises a first ferromagnetic layer 30 followed by an insulating layer 32 and a second ferromagnetic layer 34. A well-known, exemplary TMR structure includes, within the first ferromagnetic layer 30, a series of sub-layers comprising Ta/Ni—Fe/Fe—Mn/

Ni—Fe. The insulating layer 32 of the illustrated embodiment comprises aluminum oxide, preferably in a thickness between about 0.5 nm and 2.5 nm. The second ferromagnetic layer 34 preferably comprises sub-layers, Ni—Fe/Ta. As shown in FIG. 1B, the barrier layer 28 preferably overlays the second ferromagnetic layer 34.

The TMR stack can be formed by any suitable method, but is preferably formed as a stack of blanket layers and then patterned into a plurality of cells for the array. The insulating layer 26, preferably silicon nitride or a form of silicon oxide, is then deposited thereover and polished back (e.g., by chemical mechanical planarization) to expose the TMR stack's top surface. Another insulating layer 36, typically comprising a form of silicon oxide, is deposited over the insulating layer 26 and the magnetic memory cell 24. Alternatively, a single insulating layer can take the place of the two illustrated layers 26, 36.

With reference to FIG. 1B, a trench 38 is etched into the silicon oxide layer 36 as a first step in using the damascene process to form the top electrode, or word line, for the magnetic cell 24. The trench 38 that will contain the word line runs into and out of the page, perpendicular to the bottom electrode structure 10, and thus traverses several cells in the array. In the illustration of FIG. 1B, the bottom of the trench 38 is shown in contact with the barrier layer cap 28 on the top surface of the magnetic cell 24 as a preferred embodiment.

In another arrangement, the trench may be more shallow, leaving a thin portion of the insulating silicon oxide layer between the bottom of the trench and the top of the magnetic cell.

Figure 2:
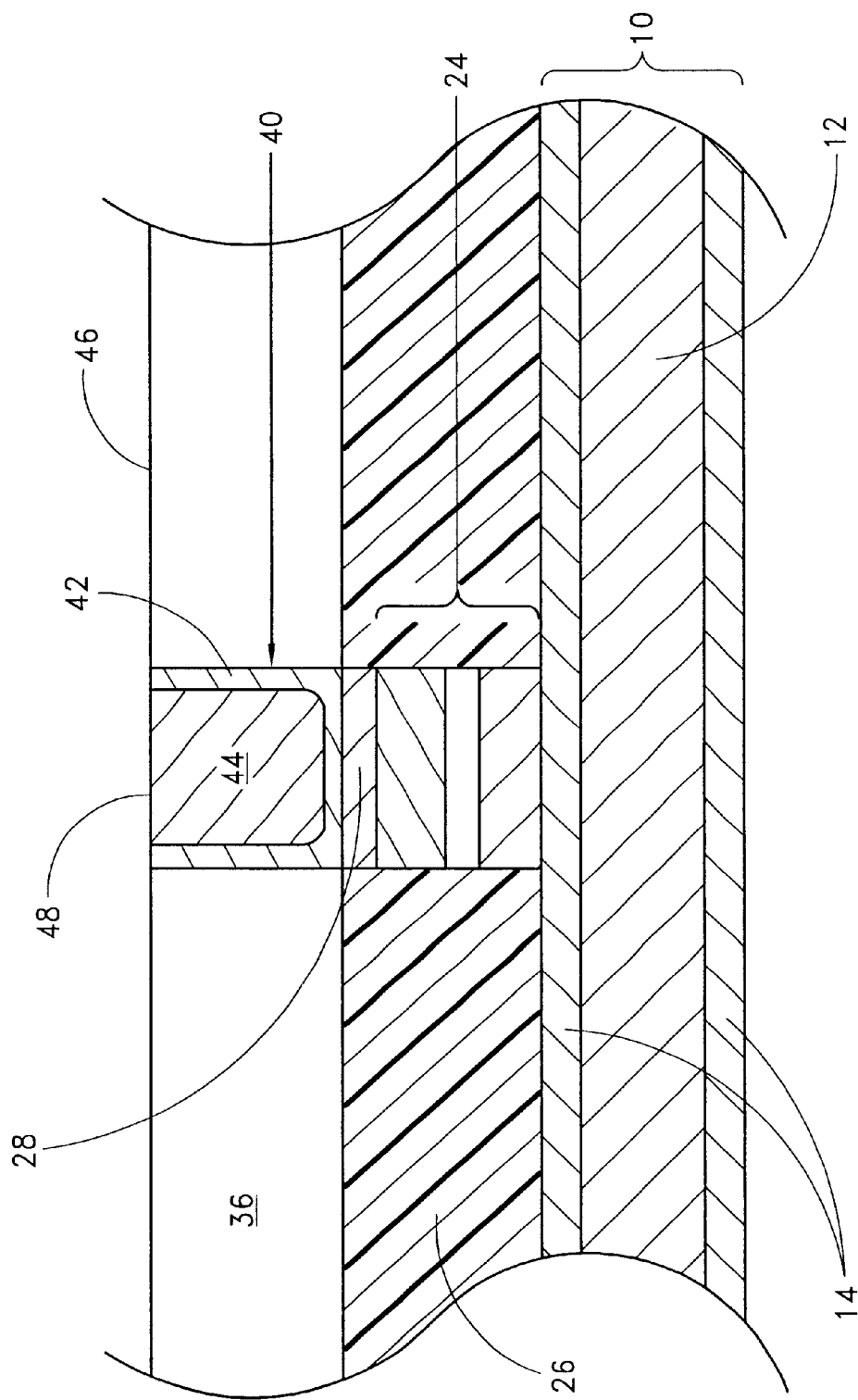
FIG. 2 is a cross section showing the damascene trench of FIG. 1B lined with a barrier material and filled with copper.

An MRAM, fabricated with a top electrode 40 having no magnetic keeper, is shown in FIG. 2. The bottom electrode 10 is preferably clad with at least a barrier layer and, more preferably, with the magnetic keeper structure described above with reference to FIG. 1A. Using FIG. 1B as a starting point, the etched trench 38 preferably has a depth of about 100–300 nm and is about 200 nm in the illustrated embodiments. The width of trench 38 is preferably about 100–300 nm, and is about 200 nm in the illustrated embodiments. A barrier layer 42 is deposited to line the trench 38. The preferred barrier material is tantalum, although any conductive material that is a good diffusion barrier for confining copper is suitable. The thickness of the barrier layer is preferably about 1–20 nm, more preferably about 2–10 nm and is about 5 nm in the illustrated embodiments. A highly conductive material 44 is deposited to fill the trench 38 and form the top electrode 40 (along a word line, in the illustrated configuration). The preferred material is copper, but other conductive materials such as aluminum, gold or silver may also be used. The copper may be deposited in a two-step process wherein first a seed layer is deposited by physical vapor deposition and then the trench is filled completely by electroplating. Alternatively, the copper may be deposited completely by physical vapor deposition.

In FIG. 2, the top surface 46, 48 has been planarized to remove excess barrier and conductive material and to make the top surface 48 of the top electrode 40 level with the top surface 46 of the insulating layer 36. In the preferred embodiments, the top electrode 40 also includes magnetic keeper structures that help confine magnetic fields within each cell across the array. The embodiments below employ the structures of FIG. 1B or 2 as starting points.

The embodiments that follow have magnetic keeper structures that are multi-layered, including both barrier layers and soft magnetic material layers. Although this is preferred, it should be understood that the barrier layer(s) may not be employed where the magnetic material layer can also serve as a diffusion barrier to copper, in addition to performing the magnetic keeper function and confining the magnetic fields. Thus, the term "magnetic keeper," as used herein, includes at least a magnetic material layer, and preferably also includes one or more barrier layers. Alternative structures include simply a single magnetic material layer as the magnetic keeper or the magnetic material layer and only one barrier layer. The latter arrangement is shown in FIGS. 6A–6D.

Patterned Partial Keeper

Figure 3A:
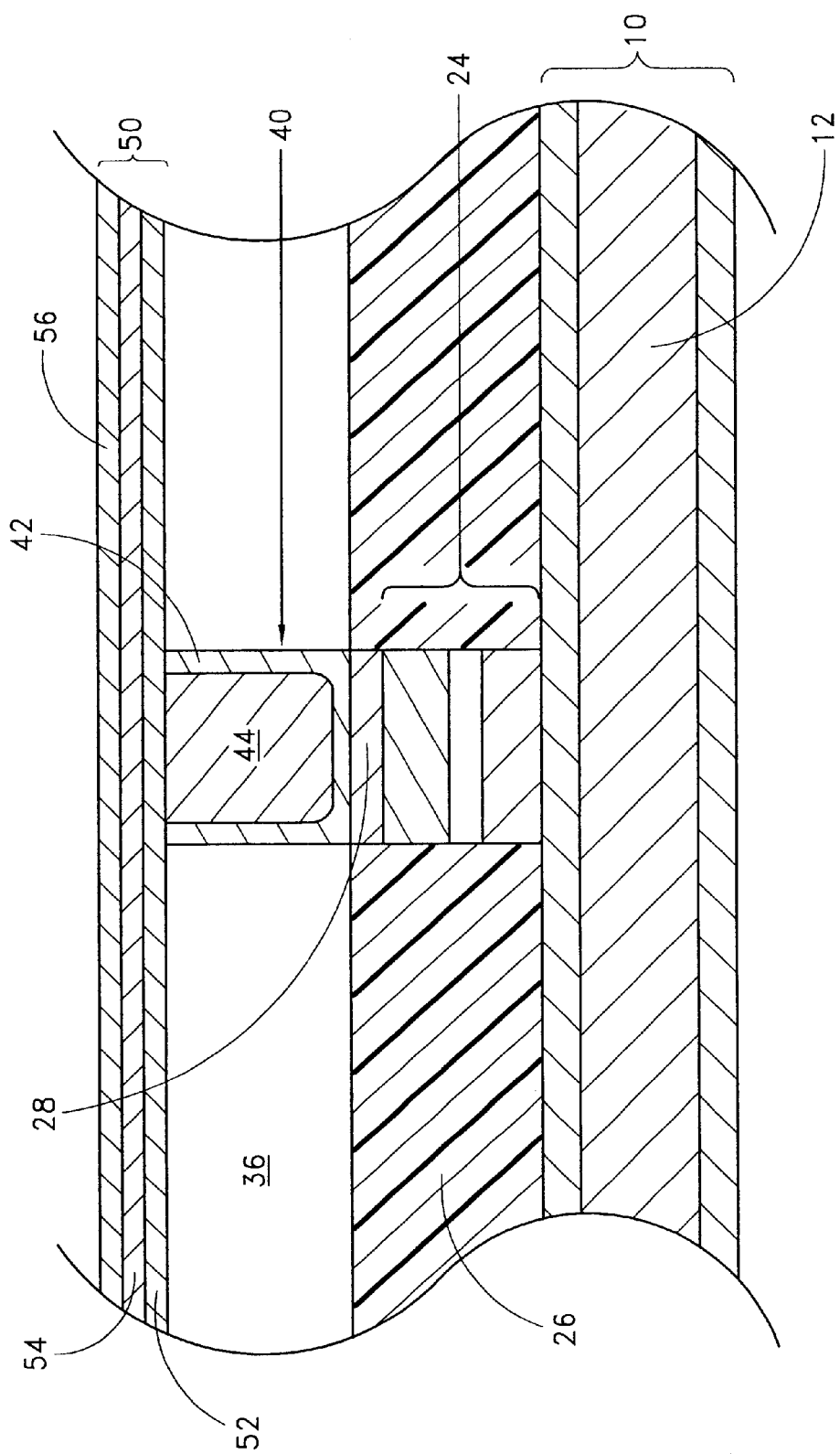
FIG. 3A is a cross section showing a blanket layer, comprising a stack of barrier/magnetic/barrier materials, deposited over the structure of FIG. 2, in accordance with a first embodiment of the present invention.
Figure 3B:
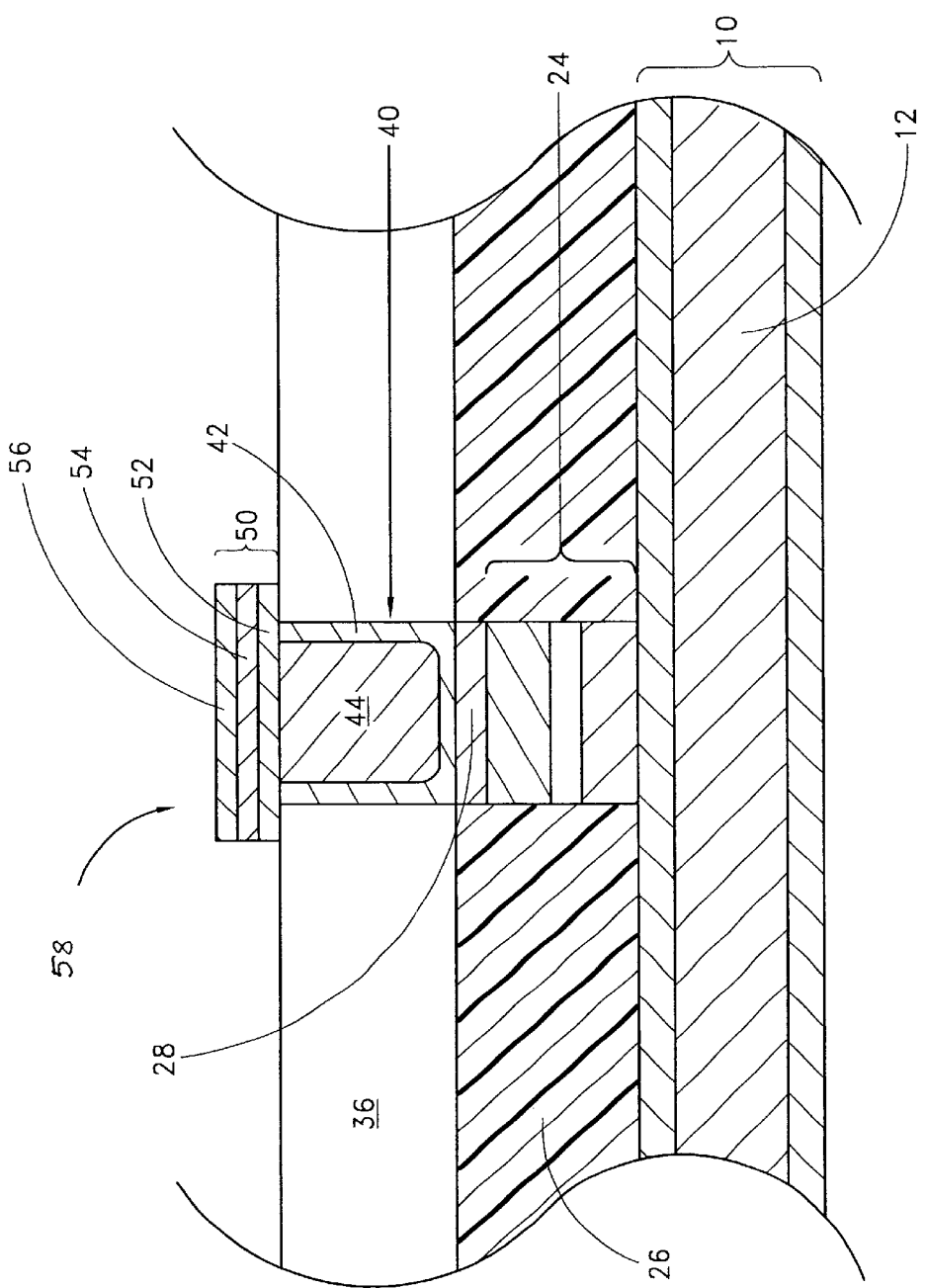
FIG. 3B shows the structure of FIG. 3A after patterning and etching to leave the barrier and magnetic material stack over and slightly wider than the line in which the top electrode is formed.

The most simple configuration for a magnetic keeper for a word line is shown in the first embodiment, illustrated in FIGS. 3A and 3B. This embodiment can be understood using FIG. 2 as a starting point. In the illustrated embodiment, a stack 50 of blanket layers is deposited over the planarized top surface as shown in FIG. 3A, although it is possible to form this keeper with a magnetic material blanket layer alone. A first layer 52 is a barrier layer; a second layer 54 is a magnetic material preferably comprising a soft magnetic material, such as permalloy (Ni—Fe) and more preferably Co—Fe, and a third layer 56 is another barrier layer. Preferably the barrier layers comprise Ta. The thickness of each layer in the stack is preferably about 1–20 nm, more preferably 2–10 nm and most preferably about 5 nm. The layers in the stack 50 can be deposited by any suitable method. In the illustrated embodiment, the layers are formed by physical vapor deposition all in the same cluster tool.

The stack 50 is patterned and etched using standard photolithography techniques, preferably leaving a patterned partial keeper over the area defining the memory cell. In another arrangement, the keeper is patterned to extend along the top surface of the word line top electrode 40 that runs into and out of the page as shown in the cross section of FIG. 3B. In still another arrangement (and not shown), the blanket stack may be patterned and etched to extend over an entire array, with openings only over vias (not shown) in the insulating layer 36.

The overlying structure is referred to herein as a partial keeper 58 because it does not overlay all external surfaces of the upper conductor or top electrode 40. "External surfaces," as used herein, refers to all surfaces of the top electrode 40 that do not face the magnetic storage element or TMR stack 24 in the illustrated embodiment.

Self-Aligned Partial Keeper

Figure 4A:
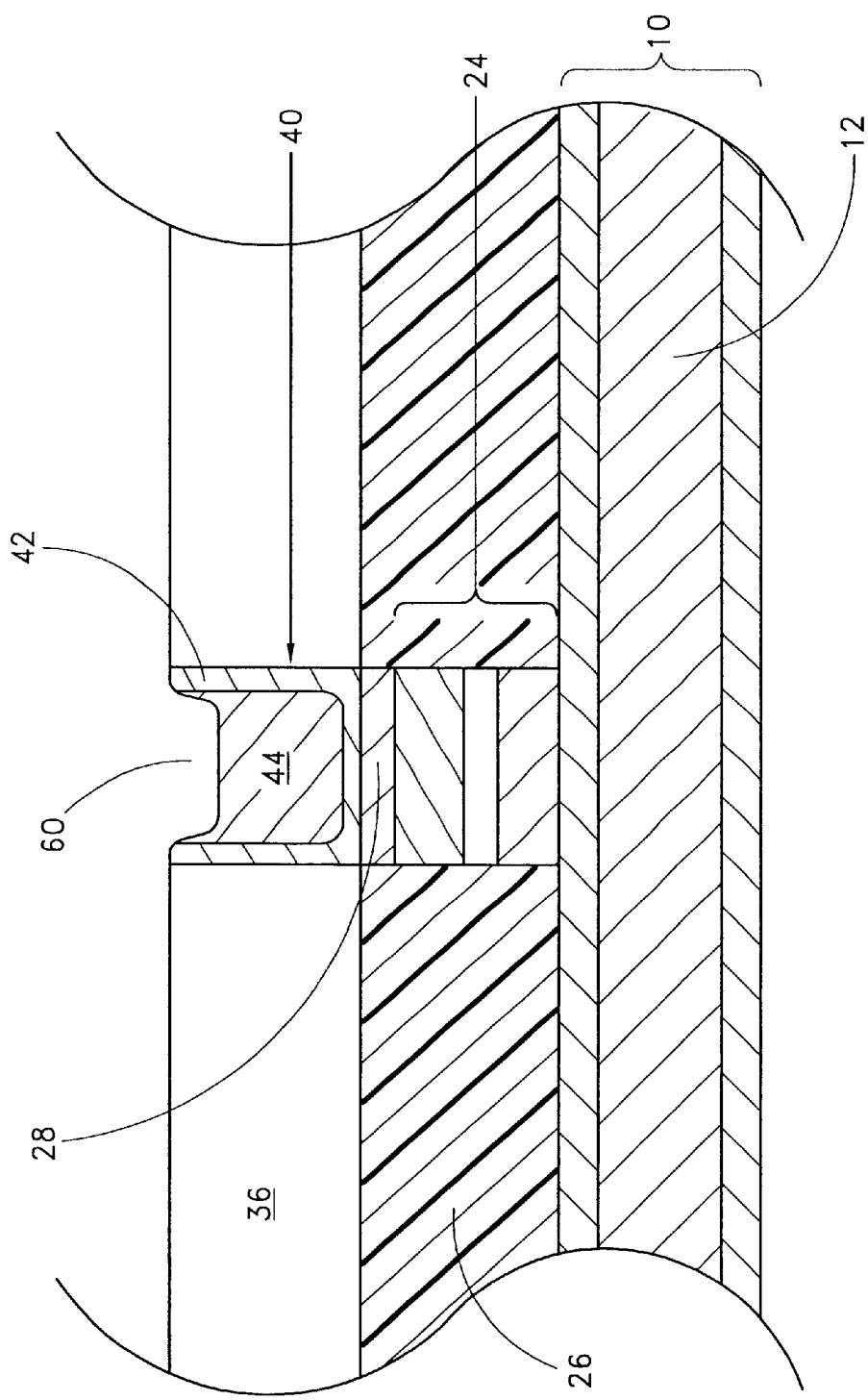
FIG. 4A illustrates the structure of FIG. 2 after the conductive material of the top electrode has been etched to make a recess into the top electrode, in accordance with a second embodiment of the present invention.

FIG. 4A shows the first step in formation of a self-aligned partial keeper from the top electrode structure of FIG. 2, in accordance with a second embodiment. Like reference numerals are employed for elements corresponding to those of the previous embodiment. The top surface of the conducting line 44 is recessed by a selective etch, preferably by wet etching. For example, a solution of glacial acetic acid and nitric acid in a 10:1 (acetic:nitric) ratio will selectively etch copper 44 as compared to oxide 36 and tantalum 42. For other materials, the skilled artisan can readily determine a suitable selective chemistry. The depth of the recess 60 is between about 5 nm and 100 nm, more preferably between about 10 nm and 30 nm and most preferably about 15 nm.

Figure 4B:
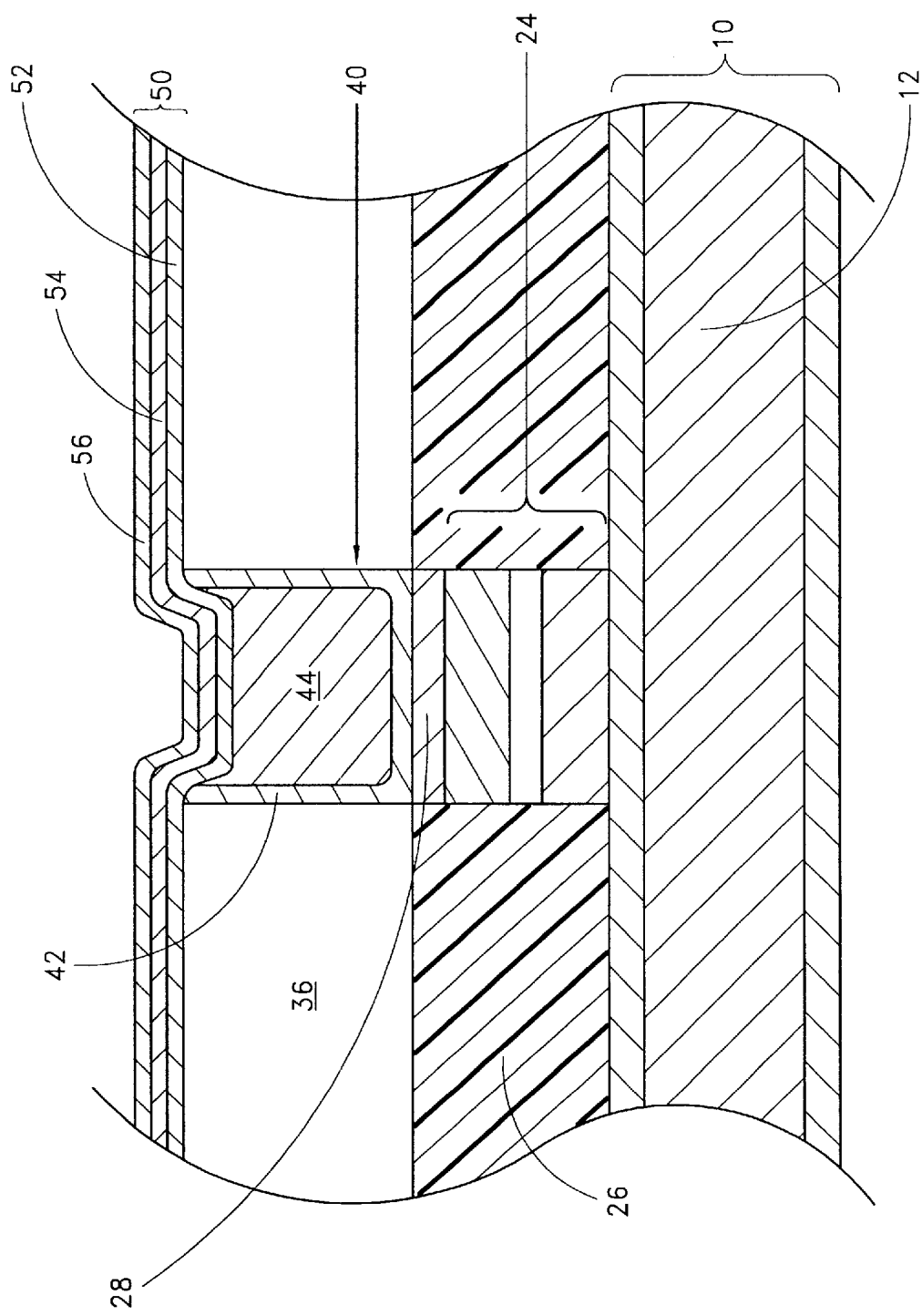
FIG. 4B shows the structure of FIG. 4A after a blanket layer, comprising a stack of barrier/magnetic/barrier materials, has been deposited over the recessed top electrode.

Referring to FIG. 4B, a magnetic material is deposited into the recess 60. In the illustrated embodiment, a stack 50 of blanket layers is deposited over the recess 60 and top surface 46 of the insulating layer 36. The illustrated stack 50 comprises a first barrier layer 52, a magnetic material layer 54 and a second barrier layer 56. Preferably the barrier layers 52, 56 comprise Ta. The magnetic layer preferably comprises a sQft magnetic material, such as permalloy (Ni—Fe) and more preferably Co—Fe. The thickness of each layer in the stack is preferably about 1–20 nm, more preferably 2–10 nm and most preferably about 5 nm. The layers in the stack 50 can be formed in any suitable manner but are preferably formed by physical vapor deposition all in the same cluster tool.

With reference to FIG. 4C, the structure is etched back, preferably planarized, more preferably by chemical-mechanical polishing, which leaves a flat top surface 62 flush with the top surface 46 of the insulating layer 36. The planarization leaves self-aligned partial keeper 64 within the recess 60 over the upper electrode or word line 40.

The self-aligned partial keeper 64 is referred to as such because it is confined to the top electrode 40 without a mask step. The keeper is partial because it covers only one out of three possible external surfaces of the top electrode.

Spacer Keeper

Figure 5A:
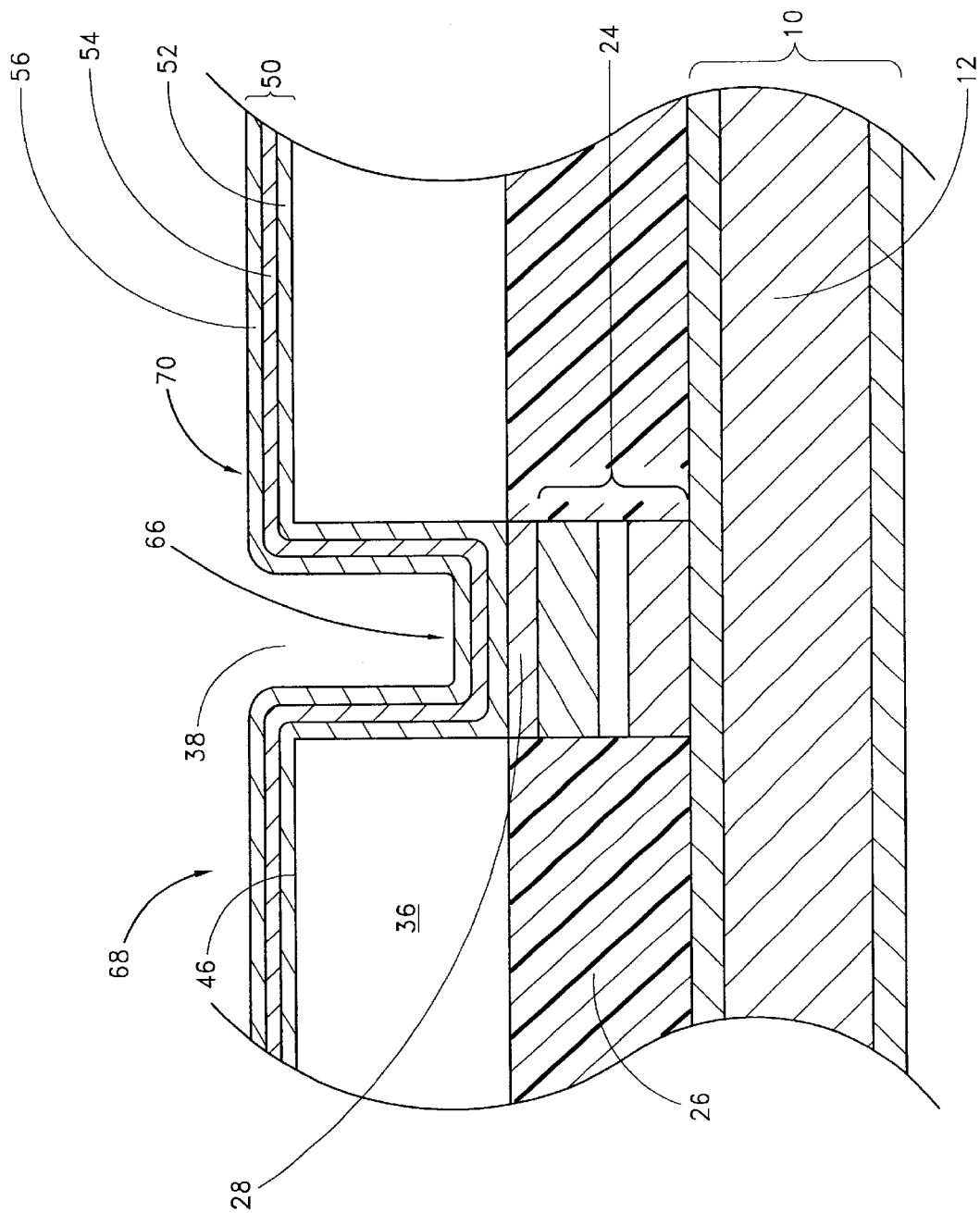
FIG. 5A illustrates the structure of FIG. 1B after a stack of barrier/magnetic/barrier materials has been deposited to line the damascene trench, in accordance with a third embodiment of the present invention.

A third embodiment of the current invention is illustrated in FIGS. 5A–5D. The starting point for this embodiment is the partially fabricated MRAM described earlier with respect to FIG. 1B, wherein the trench 38 for the top electrode has been etched. At least a magnetic material layer lines the trench 38. In the illustrated embodiment, the stack 50 of layers, including the magnetic material layer 54 as well as the barrier layers 52, 56 is deposited with good conformity over the top surface 46 and into the trench 38 as shown in FIG. 5A. A selective spacer etch is performed to remove the horizontal portions 66, 68, 70 of the stack 50. The selective etch comprises an etch with a physical (sputtering) component, such as argon ion milling or a chlorine-based or fluorine-based reactive ion etching, as will be appreciated by the skilled artisan.

Figure 5B:
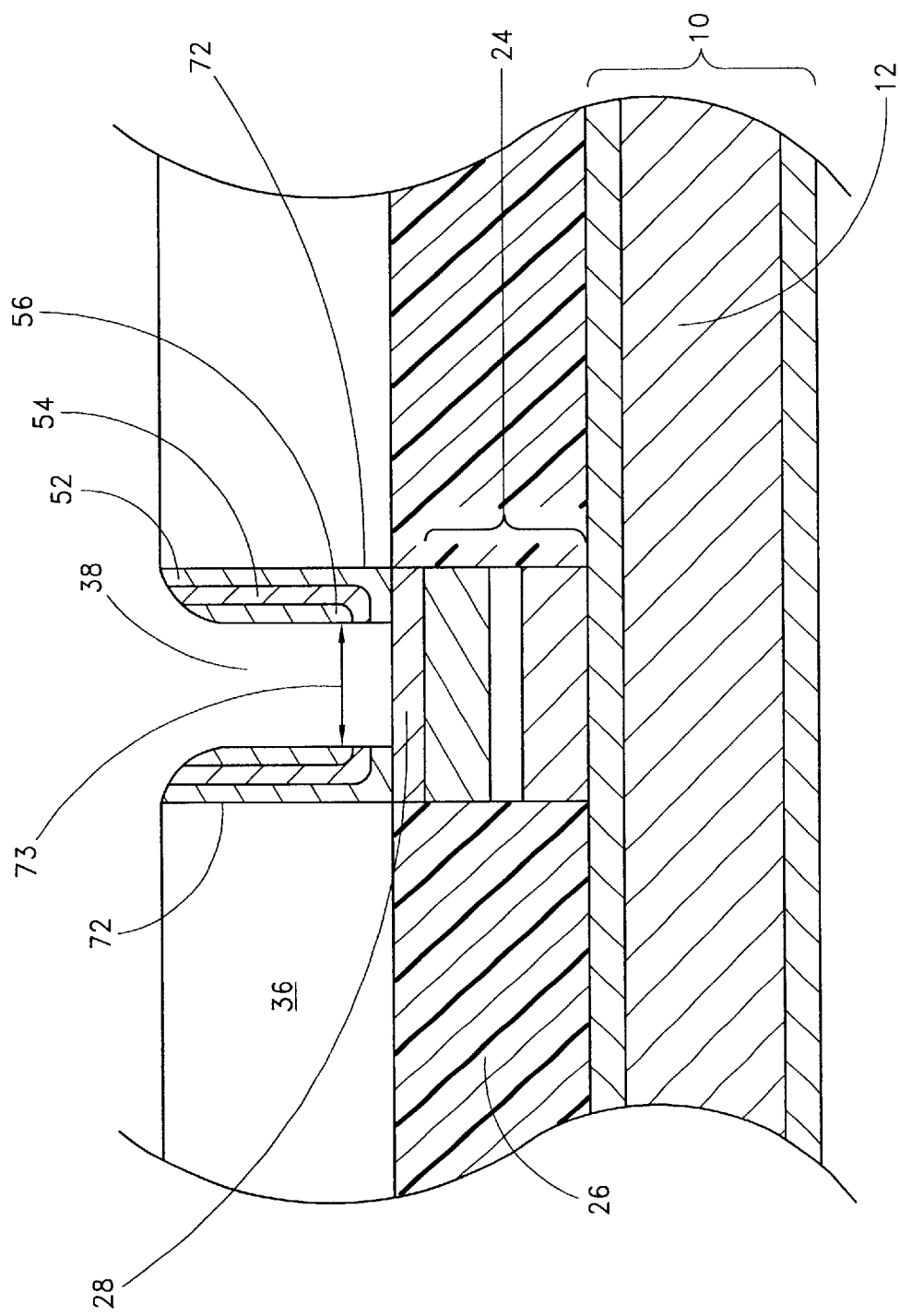
FIG. 5B shows the structure of FIG. 5A after a spacer etch has removed the horizontal portions of the deposited stack of layers.

FIG. 5B shows the remaining portions of the layers 52, 54, 56 along the vertical sidewalls 72 of the trench 38 after the spacer etch. Preferably, at least all the soft magnetic material layer 54 is removed from the bottom of the trench 38 before proceeding, as remaining material can disrupt or block the interaction between the word line magnetic field and the magnetic bit 24. While the illustrated embodiment shows all of the stack 50 removed from horizontal portions, thus ensuring complete removal of the magnetic layer 54 from those portions, it will be understood that the spacer etch can also leave part of the lower barrier layer 52 over the bit 24. A spacer keeper 73 is left lining the trench sidewalls 72.

Figure 5C:
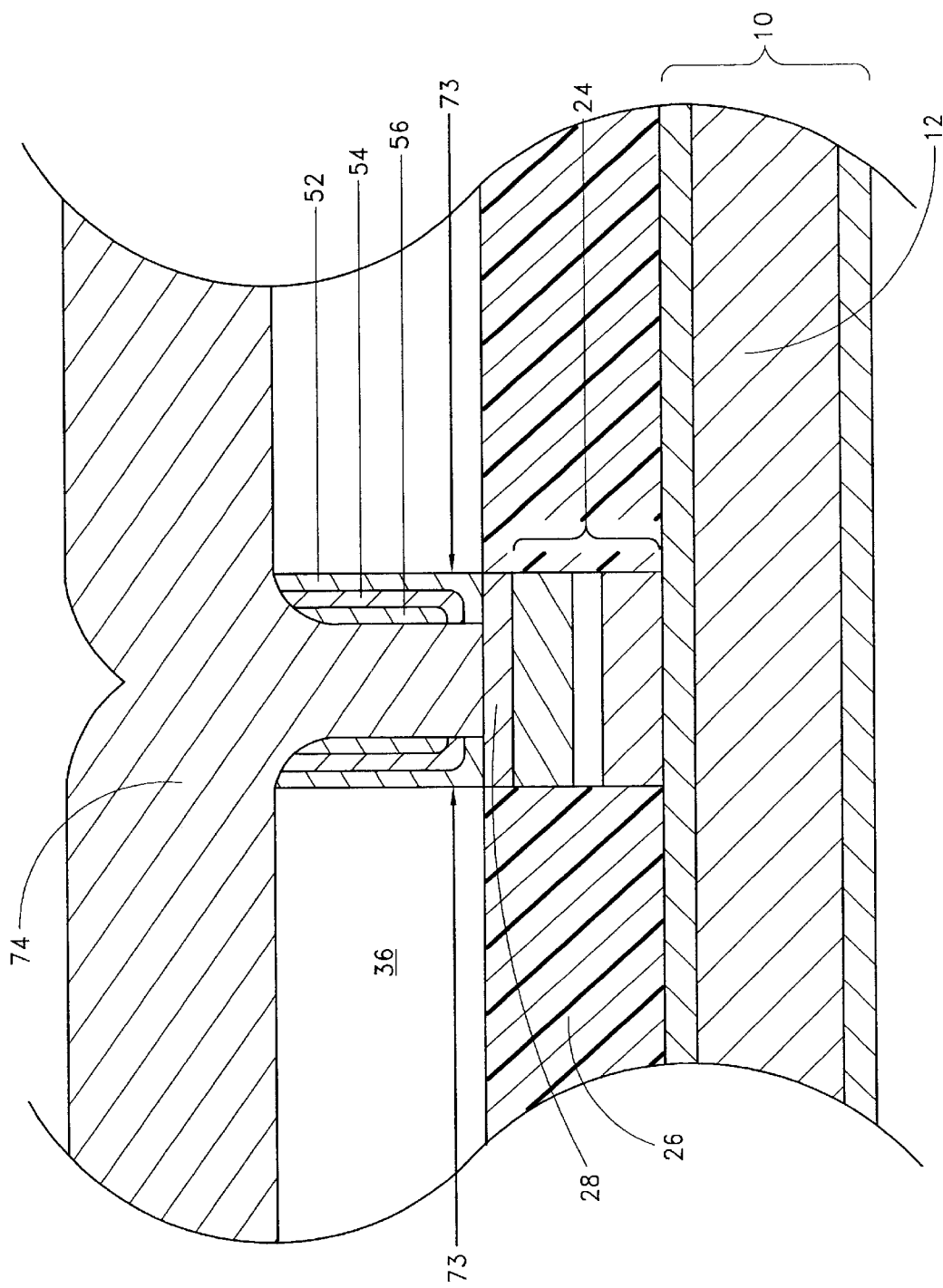
FIG. 5C is a cross section of the structure of FIG. 5B after a blanket conductive layer has been deposited to fill the trench.

Referring to FIG. 5C, a layer of conductive material 74, preferably copper, is then deposited to fill the trench 38.

Figure 5D:
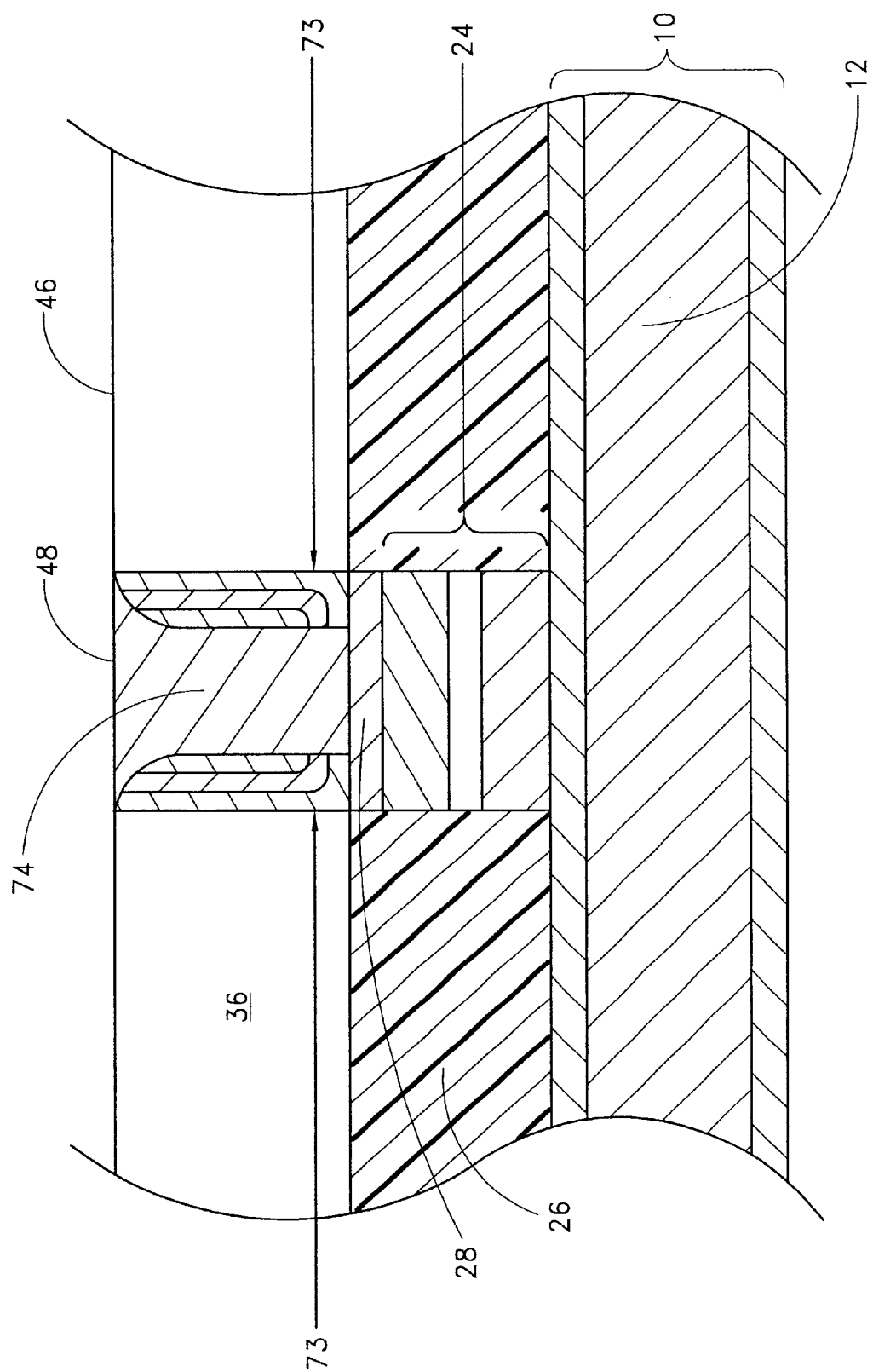
FIG. 5D shows the structure of FIG. 5C after planarization of the conductive layer.

Referring to FIG. 5D, the conductive material 74 is planarized, preferably by chemical-mechanical polishing, which removes excess conductive material and leaves the conductive material 74 within the trench 38 with external sidewall surfaces covered by the spacer keeper 73, completing the top electrode 40 of the third embodiment. Planarization leaves an upper surface 48 flush with an upper surface 46 of the insulator 36.

Self-Aligned Keeper

A self-aligned keeper, in accordance with a fourth embodiment, is described with reference to FIGS. 6A–6D. This embodiment is similar to the spacer keeper 73 as described above with respect to FIG. 5D. The fourth embodiment uses only two layers in the magnetic keeper structure. Alternatively, the self-aligned keeper can be made with the three-layer stack described for embodiments above, or a single layer can serve as both the magnetic layer and barrier function. The starting point for this embodiment is the partially fabricated MRAM described earlier with respect to FIG. 1B, wherein the trench 38 for the top electrode has been etched.

Figure 6A:
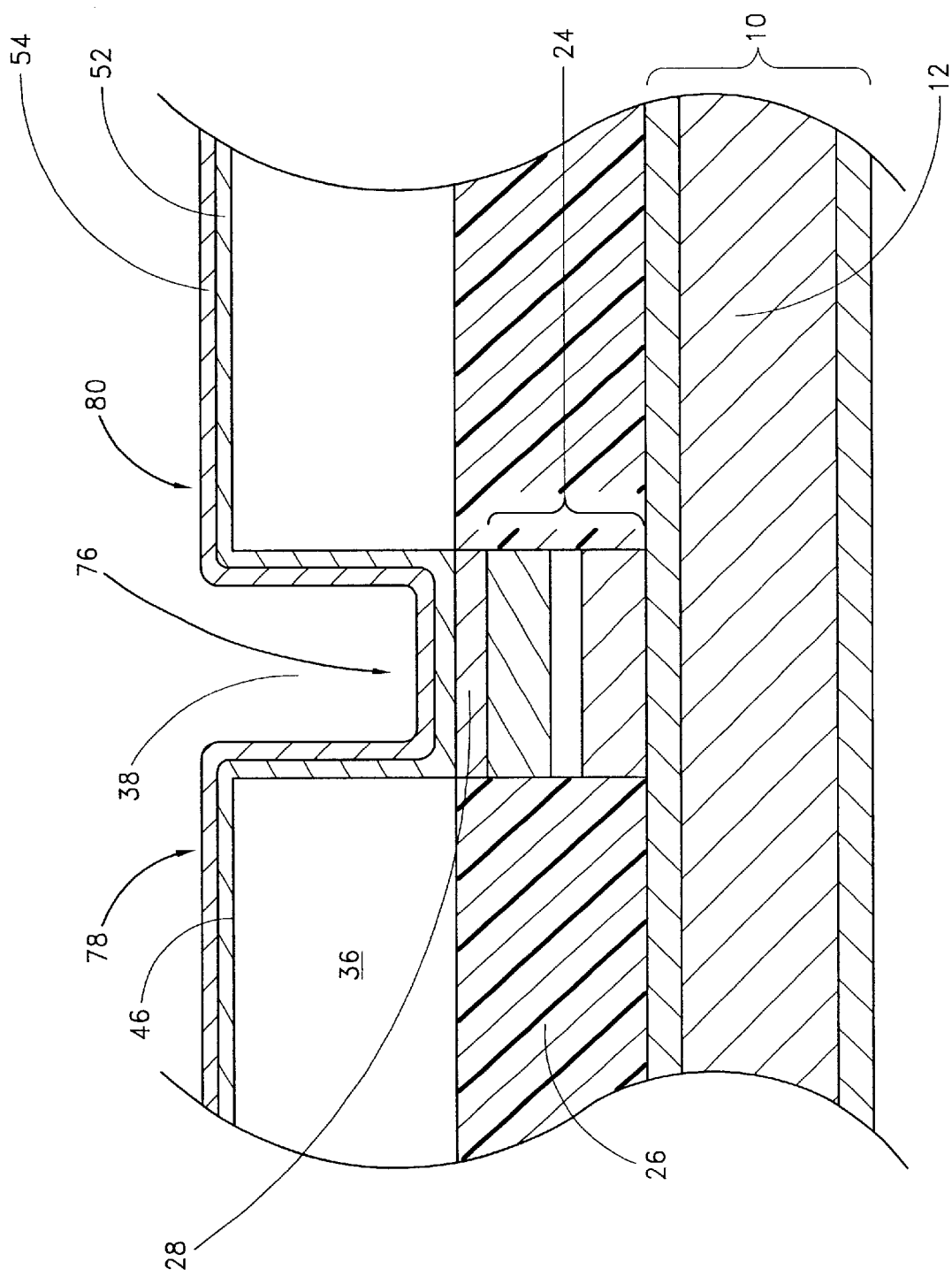
FIG. 6A illustrates the structure of FIG. 1B after barrier and magnetic layers have been deposited to line the damascene trench, in accordance with a fourth embodiment of the present invention.

With reference to FIG. 6A, the barrier layer 52 and the magnetic material layer 54 are deposited with good conformity over the top surface 46 of the insulating layer 36 and into the trench 38. Preferably the barrier layer 52 comprises Ta. The magnetic layer comprises preferably a soft magnetic material, such permalloy (Ni—Fe). Co—Fe is particularly preferred for use in this two-layer stack, whereby the magnetic material 34 will directly contact copper (see FIG. 6C). A selective spacer etch is performed to remove the horizontal portions 76, 78, 80 of the barrier layer 52 and the magnetic material layer 54. The selective etch comprises an etch with a physical (sputtering) component, such as argon ion milling or a chlorine-based or fluorine-based reactive ion etching, as will be appreciated by the skilled artisan. Preferably, at least all the soft magnetic material layer 54 is removed from the bottom of the trench 38 before proceeding, as remaining material can disrupt or block the interaction between the word line magnetic field and the magnetic bit 24.

Figure 6B:
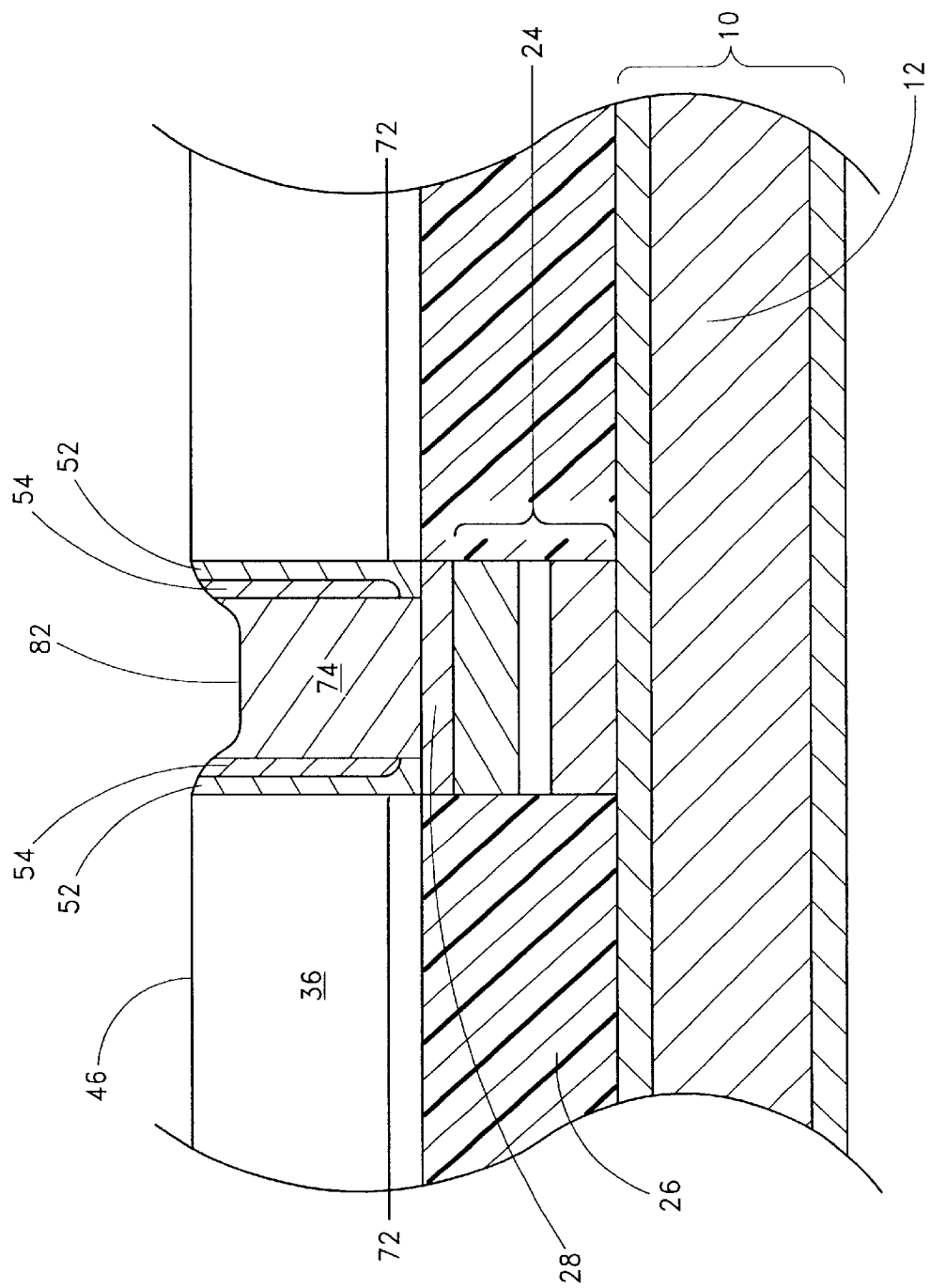
FIG. 6B is a cross section of a partially fabricated MRAM structure, wherein the conductive material has been selectively recessed, in accordance with a fourth embodiment of the present invention.

FIG. 6B shows the remaining portions of the layers 52, 54, along the vertical sidewalls 72 of the trench after the selective spacer etch, as well as subsequent via fill and recess steps, discussed below. While the illustrated embodiment shows all material from layers 52, 54 removed from horizontal portions, thus ensuring complete removal of the magnetic layer 54 from those portions, it will be understood that the spacer etch can also leave part of the barrier layer 52 over the bit 24.

As shown in other embodiments, a layer of conductive material 74, preferably copper, is deposited to fill the trench, and the top surface is planarized, preferably by chemical-mechanical polishing. Excess conductive material is removed, leaving conductive material 74 within the trench and barrier 52 and magnetic 54 layers along the external sidewall surfaces 72. The conductive material extends along a trench into and out of the page, serving as an upper line 74, comprising a word line in the illustrated arrangement.

A selective etch is performed to create a recess 82 in the top surface of the word line 74 as shown in FIG. 6B. The etch is performed preferably by wet etching. For example, a solution of glacial acetic acid and nitric acid in a 10:1 (acetic:nitric) ratio will selectively etch the copper 74 as compared to the oxide 36. Alternatively the recess 82 can be made by extending the previous chemical-mechanical polishing and using an appropriate selective chemistry with the polish. For other materials, the skilled artisan can readily determine a suitable selective chemistry.

Figure 6C:
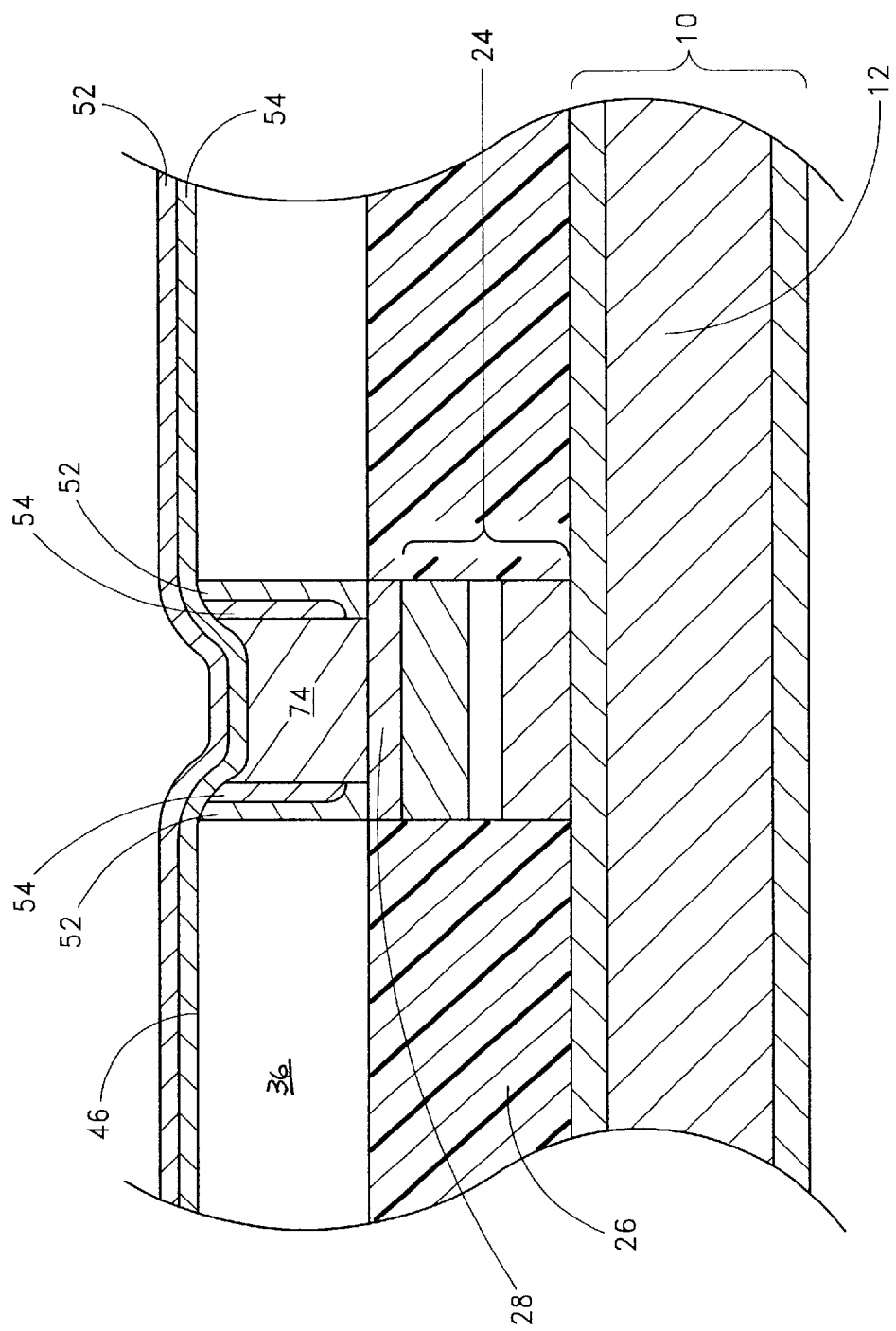
FIG. 6C is a cross section showing the structure of FIG. 6B after a blanket layer, comprising a magnetic material layer and a barrier layer, has been deposited over the recessed conductive material and the insulating layer.

With reference to FIG. 6C, at least a magnetic material and preferably a second series of blanket layers, comprising the top portion of the magnetic keeper for this embodiment, is deposited over the top surface, filling the recess 82. Preferably, the first layer 54 is a soft magnetic material, such as Co—Fe, and the second layer 52 comprises a barrier layer, such as Ta.

Figure 6D:
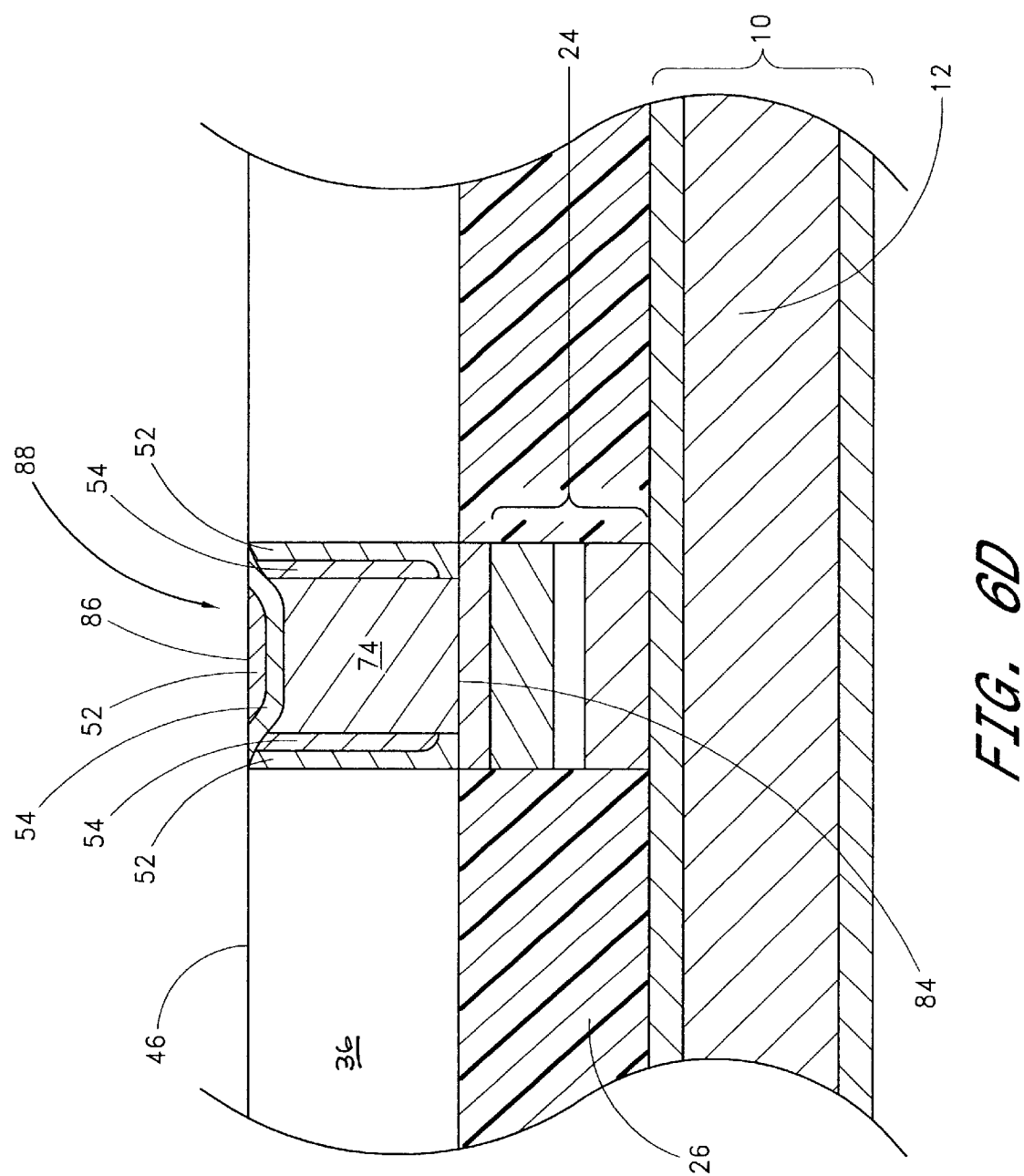
FIG. 6D is a cross section showing the structure of FIG. 6C after planarizing to remove the barrier and magnetic materials stack from over the insulating layer.

FIG. 6D shows the structure after chemical-mechanical polishing to remove the excess magnetic keeper material. The upper line 74 is clad along three sides with the magnetic material layer 54 and the barrier layer 52. Advantageously, the magnetic material is formed as a continuous layer 54 around the three sides of the upper line 74. The electrode surface 84 facing the magnetic bit 24 has no magnetic material cladding. A top surface 86 of the structure is preferably flush with the upper surface 46 of the surrounding insulating layer 36, making it easier to perform further processing.

The self-aligned keeper 88 is referred to as such because it is confined to the upper line 74 without a mask step. This keeper is not called partial because it covers all three surfaces suitable for magnetic keeper cladding.

It will be understood that the fourth embodiment, illustrated in FIGS. 6A–6D, represents a combination of the second and third embodiments with a modification to two layers in the magnetic keeper structure instead of three. Similarly, the third embodiment can be combined with the first embodiment, thereby also providing keeper material on three external surfaces of the top electrode without blocking magnetic fields between the top electrode and the underlying magnetic bit. Furthermore, it should understood that the barrier layer is not necessary to perform the magnetic keeper function and confine the magnetic fields. Alternative structures include simply a single magnetic material layer as the magnetic keeper or the magnetic material layer one or more barrier layers. The invention as described herein in the preferred embodiments provides a method for fabricating a magnetic keeper in a number of structures for a conducting line in a damascene trench, wherein the bottom surface of the trench has no keeper. This has particular application for top electrodes in magnetic memory devices. The keeper localizes the magnetic field surrounding the conducting line so that only the magnetic memory cell or bit being addressed is affected by the field. It contains the magnetic flux and directs it toward the magnetic memory structure, thus lowering the effective current density required for writing to the bit. Unaddressed neighboring bits do not feel the effects of the magnetic field and electromigration is reduced. This aids in compressing the design of magnetic memory arrays to smaller dimensions without sacrificing functionality.

The presently disclosed embodiments are therefore considered in all respects to be illustrative and not restrictive. The scope of the invention is indicated by the appended claims rather than the foregoing description and all changes that come within the meaning and range of equivalence thereof are intended to be embraced therein.

I claim:

1. A method of forming a magnetic keeper for a top electrode in a magnetic random access memory (MRAM) device, comprising:
    depositing an insulating layer over a magnetic storage element;
    etching a damascene trench into the insulating layer over the magnetic storage element;
    filling the trench with a conductive material;
    planarizing to remove the conductive material from over the insulating layer and to leave the conductive material within the trench; and
    depositing a magnetic material over the conductive material after planarizing.

2. The method of claim 1 further comprising patterning and etching the magnetic material so that the magnetic material covers at least a top surface of the conductive material.

3. The method of claim 1 wherein the magnetic material extends over an array of magnetic storage elements, further comprising patterning and etching openings in the magnetic material over contact vias in the insulating layer.

4. The method of claim 1 further comprising, after planarizing the conductive material and before depositing the stacked layers, forming a recess in a top surface of the conductive layer.

5. The method of claim 4 wherein forming the recess comprises selectively etching the conductive material.

6. The method of claim 5 wherein selectively etching comprises wet etching.

7. The method of claim 6 wherein wet etching comprises a solution of glacial acetic acid and nitric acid in a 10:1 (acetic:nitric) ratio.

8. The method of claim 5 wherein selectively etching comprises chemical-mechanical polishing.

9. The method of claim 4 further comprising, after depositing the magnetic material, planarizing to remove the magnetic material from over the insulating layer and to leave the magnetic material within the recess.

10. The method of claim 1 wherein the conductive material comprises copper.

11. The method of claim 10 wherein filling the trench with a conductive material comprises first depositing a copper seed layer using physical vapor deposition and then electroplating copper over the seed layer.

12. The method of claim 1 further comprising forming an initial barrier layer as a trench lining after etching the damascene trench and before filling the trench with conductive material.

13. The method of claim 12, additionally comprising forming a magnetic material layer and then a top barrier layer over the initial barrier layer as a complete trench lining.

14. The method of claim 13, further comprising performing a spacer etch to remove at least all magnetic material from the bottom of the trench after forming the complete trench lining and before filling the trench.

15. The method of claim 14 wherein the complete trench lining comprises stacked layers of tantalum/Co—Fe/tantalum.

16. The method of claim 14 wherein the complete trench lining comprises stacked layers of tantalum/permalloy (Fe—Ni)/tantalum.

17. The method of claim 13 wherein the complete trench lining is formed using physical vapor deposition.

18. The method of claim 13 wherein the complete trench lining is deposited in only one cluster tool.

19. A method of forming a magnetic keeper for a top electrode in a magnetic random access memory (MRAM), comprising:
    depositing an insulating layer over a magnetic storage element;
    etching a damascene trench into the insulating layer over the magnetic storage element;
    lining the trench with a magnetic material;
    selectively removing the magnetic material from a bottom of the trench; and
    filling the trench with a conductive material.

20. The method of claim 19 wherein lining the trench further comprises forming a first barrier liner layer before and a second barrier liner layer after lining the trench with the magnetic material.

21. The method of claim 20 wherein the first barrier liner layer is tantalum, the magnetic material is Co—Fe and the second barrier liner layer is tantalum.

22. The method of claim 19 wherein selectively removing the magnetic material from the bottom of the trench comprises a selective etch with a physical etch component.

23. The method of claim 22 wherein the selective etch comprises argon ion milling.

24. The method of claim 22 wherein the selective etch comprises a chlorine-based or fluorine-based reactive ion etch.

25. The method of claim 19 wherein, additionally, stacked layers of a first barrier layer, a magnetic layer and a second barrier layer are deposited onto a top surface of the conductive material.

26. The method of claim 25 wherein, additionally, a recess is formed in the top surface of the conductive material before the stacked layers are deposited.

27. The method of claim 26 wherein the first barrier layer is tantalum, the magnetic layer is Co—Fe and the second barrier layer is tantalum.

28. The method of claim 27 wherein, additionally, a top surface of the stacked layers is planarized.

29. The method of claim 19 wherein the magnetic storage element comprises a multi-layer tunneling magnetoresistance (TMR) structure.

30. The method of claim 29 wherein the TMR structure comprises a first ferromagnetic layer, an insulating layer and a second ferromagnetic layer.

31. The method of claim 30 wherein the first ferromagnetic layer includes a series of sub-layers comprising Ta/Ni—Fe/Fe—Mn/Ni—Fe.

32. The method of claim 30 wherein the insulating layer comprises aluminum oxide.

33. The method of claim 30 wherein the second ferromagnetic layer comprises sub-layers Ni—Fe/Ta.

34. The method of claim 19, wherein the conductive material is copper.

35. The method of claim 19, wherein comprising:

lining the bottom and sidewalls of the trench with a first barrier layer prior to lining the bottom and sidewalls of the trench with the magnetic material;

lining the bottom and sidewalls of the trench with a second barrier layer after lining the bottom and sidewalls of the trench with the magnetic material; and prior to the filling of the trench with a conductive material, selectively removing the first barrier layer, the magnetic material, and the second barrier layer from the bottom of the trench and from a top surface of the insulating layer such that there is substantially no magnetic material at the bottom of the trench and such that the top surface of the insulating layer is substantially flat.

36. The method of claim 19, further comprising:

lining the bottom and sidewalls of the trench with a first barrier layer prior to lining the bottom and sidewalls of the trench with the magnetic material;

prior to the filling of the trench with a conductive material, selectively removing the first barrier layer and the magnetic material from the bottom of the trench and from a top surface of the insulating layer such that there is substantially no magnetic material at the bottom of the trench and such that the top surface of the insulating layer is substantially flat;

selectively etching a recess in a top surface of the conductive material that fills the trench such that the recess is below a flat level of the top surface of the insulating layer;

depositing a second barrier layer on the top surface of the insulating layer and on the recess in the top surface of the conductive material;

depositing the magnetic material on the second barrier layer; and planarizing above the insulating layer to remove the second barrier layer and the magnetic material from the top surface of the insulating layer.

* * * * *

UNITED STATES PATENT AND TRADEMARK OFFICE
CERTIFICATE OF CORRECTION

PATENT NO.    : 6,413,788 B1
DATED         : July 2, 2002
INVENTOR(S)   : Mark E. Tuttle It is certified that error appears in the above-identified patent and that said Letters Patent is hereby corrected as shown below:

<u>Title page,</u>
Item [57], ABSTRACT, the word "laterial" should read -- material --.

<u>Column 1,</u>
Line 41, the portion of the sentence "line, generates" should read -- line, it generates --.

<u>Column 6,</u>
Line 67, the word "sQft" should read -- soft --.

Signed and Sealed this

Twelfth Day of August, 2003

JAMES E. ROGAN
*Director of the United States Patent and Trademark Office*